(12) United States Patent
Pizzetti et al.

(10) Patent No.: US 10,865,484 B2
(45) Date of Patent: Dec. 15, 2020

(54) SOLUTION AND METHOD FOR ETCHING TITANIUM BASED MATERIALS

(71) Applicant: TECHNIC FRANCE, Saint Denis (FR)

(72) Inventors: Christian Pizzetti, La Batie Divisin (FR); Marine Cazes, Genas (FR); Jérôme Daviot, Chatenoy le Royal (FR); Philippe Vernin, Paris (FR)

(73) Assignee: TECHNIC FRANCE, Saint Denis (FR)

( * ) Notice: Subject to any disclaimer, the term of this patent is extended or adjusted under 35 U.S.C. 154(b) by 0 days.

(21) Appl. No.: 16/089,572

(22) PCT Filed: Mar. 29, 2017

(86) PCT No.: PCT/EP2017/057388
§ 371 (c)(1),
(2) Date: Sep. 28, 2018

(87) PCT Pub. No.: WO2017/167797
PCT Pub. Date: Oct. 5, 2017

(65) Prior Publication Data
US 2019/0127858 A1 May 2, 2019

(30) Foreign Application Priority Data

Mar. 29, 2016 (EP) .................... 16305360

(51) Int. Cl.
| | | |
|---|---|---|
| *C09K 13/02* | (2006.01) | |
| *C23F 1/38* | (2006.01) | |
| *C23G 1/20* | (2006.01) | |
| *H01L 21/3213* | (2006.01) | |

(52) U.S. Cl.
CPC ............ *C23F 1/38* (2013.01); *C09K 13/02* (2013.01); *C23G 1/205* (2013.01); *H01L 21/32134* (2013.01)

(58) Field of Classification Search
None
See application file for complete search history.

(56) References Cited

U.S. PATENT DOCUMENTS

| | | | |
|---|---|---|---|
| 2004/0209443 A1 | 10/2004 | Cadieux et al. | |
| 2010/0029085 A1 | 2/2010 | Matsunaga et al. | |
| 2011/0147341 A1* | 6/2011 | Sato .......................... | C23F 1/38 216/13 |
| 2015/0027978 A1* | 1/2015 | Barnes ................... | C09K 13/00 216/13 |
| 2015/0104952 A1* | 4/2015 | Cui ................... | H01L 21/02063 438/745 |
| 2015/0175943 A1* | 6/2015 | Casteel, Jr. ....... | H01L 21/02063 510/175 |
| 2015/0210966 A1 | 7/2015 | Shimada et al. | |
| 2016/0130500 A1* | 5/2016 | Chen ....................... | C11D 3/30 216/13 |
| 2016/0185595 A1* | 6/2016 | Chen ................. | H01L 21/02063 216/13 |
| 2017/0107460 A1* | 4/2017 | Liu ....................... | C11D 3/3947 |
| 2017/0183607 A1 | 6/2017 | Shimada | |

FOREIGN PATENT DOCUMENTS

| | | |
|---|---|---|
| CN | 100526507 C | 8/2009 |
| WO | WO 2008/114616 A1 | 9/2008 |
| WO | WO 2013/101907 A1 | 7/2013 |
| WO | WO 2014/197808 A1 | 12/2014 |
| WO | WO 2015/031620 A1 | 3/2015 |
| WO | WO 2015/156171 A1 | 10/2015 |

OTHER PUBLICATIONS

Extended European Search Report, dated Oct. 5, 2016, for European Application No. 16305360.6.
International Search Report and Written Opinion of the International Searching Authority, dated Jul. 4, 2017, for Application No. PCT/EP2017/057388.

* cited by examiner

*Primary Examiner* — Shamim Ahmed
(74) *Attorney, Agent, or Firm* — Birch, Stewart, Kolasch & Birch, LLP

(57) ABSTRACT

The invention relates to a solution for etching titanium based materials, comprising from about 27 w % to about 39 w % hydrogen peroxide, from about 0.2 w % to about 0.5 w % potassium hydroxide, and at about 0.002 w % to about 0.02 w % 1,2-Diaminocyclohexane-N,N,N,N Tetra acetic Acid (CDTA), the rest being water, said solution comprising no corrosion inhibitor, and said solution having a pH comprised between about 7 and about 8. The invention further relates to a chemical composition for preparing such a solution by mixing said composition with concentrated hydrogen peroxide, said chemical composition comprising potassium hydroxide from about 5 w % to about 30 w %, C.D.T.A. at a concentration ranging from about 1% to about 5% of the potassium hydroxide concentration, the rest being water. The invention also relates to a method of etching a Titanium, Titanium nitride or Titanium Tungsten barrier layer from a microelectronic device, said method comprising contacting the Titanium, Titanium nitride or Titanium tungsten barrier layer with the solution for a time sufficient to remove the Titanium, Titanium nitride or Titanium tungsten barrier layer.

8 Claims, 3 Drawing Sheets

SOLUTION AND METHOD FOR ETCHING TITANIUM BASED MATERIALS

FIELD OF THE INVENTION

The invention relates to a ready-to-use, stable solution for etching titanium based materials, especially titanium based barrier layers formed on microelectronic devices, while being substantially compatible with other materials potentially exposed to it, such as copper, aluminum/copper, tin or its alloys, and/or dielectric materials. The invention also relates to a method for etching titanium based materials using said solution.

BACKGROUND OF THE INVENTION

In the fabrication of new generation electrical contacts, e.g. copper pillars, a barrier layer is deposited prior to copper deposition in order to reduce diffusion in the dielectrics and enhance the adhesion performances. Thin barrier layers can be deposited either by CVD (Chemical Vapor Deposition) or PVD (Physical Vapor Deposition) methods, and are usually less than or equal to 100 nm thick. The metals of choice for such barrier layers are Titanium, titanium nitride or titanium tungsten.

In copper pillars fabrication, the Titanium based barrier layer is deposited on a dielectric surface having already contact holes to underlying Copper metals layers and eventually Aluminum pads, then a Copper glue layer is deposited by PVD. On the stack, a thick photoresist is applied and developed to form holes through which electrochemical Copper will be grown, and eventually a thin layer of Tin or Tin/Silver alloy will be deposited on top of Copper. After removal of the remaining photoresist, the stack of PVD glue (seed) layer Copper and barrier layer needs to be removed selectively to other exposed metals to form isolated conductive pillars. The Copper removal is usually carried out in diluted sulfuric or phosphoric acid and hydrogen peroxide mixtures. Some Aluminum pads can be barely covered and remain partially exposed (due to lithography misalignment or specific design rules), it is then desirable to have a barrier layer removal solution that is compatible to Copper, Aluminum and Tin or Tin alloys.

The Titanium based barrier layer removal is commonly entrusted to either concentrated heated hydrogen peroxide (5 to 30 w %), S.C.1. (Standard Clean 1 for ammonia mixed with hydrogen peroxide) or similar mixture or very diluted hydrogen fluoride based solutions at room temperature specifically for pure titanium dissolution.

The usual barrier layer removal solutions suffer several weaknesses. For example hydrogen peroxide can hardly be recirculated due to decomposition and fast change in etch rate when contaminated by metals. Moreover, when Titanium nitride or Titanium is used as the barrier layer, pure hydrogen peroxide can hardly remove the Titanium oxide usually present at the surface and the interface with dielectric. SC1 (hydrogen peroxide-ammonium hydroxide mix) can enhance the etch rate on Titanium oxide but becomes very difficult to control as for the compatibility with Aluminum. Indeed, the point of use mixture of ammonia and hydrogen peroxide would require extremely specific hardware to allow the mixture to remain at a pH below 8 for Aluminum compatibility and control of Copper oxidation. Diluted Hydrogen fluoride solutions on the other hand can readily dissolve Titanium oxide but neither dissolve Titanium nitride nor Titanium tungsten. In addition, diluted hydrogen fluoride solutions are highly incompatible with Aluminum, Tin or its alloys, and silicon oxide based dielectrics. Furthermore, it is quite difficult to control the etching profiles with hydrogen fluoride based etchants, due to the very high etch rates even at very low concentrations (dissolution does not stop at early stage of rinse step).

The formulation taught by WO2008/114616 or US2015/0210966 does not give high enough etch rate on titanium metal to be of industrial interest while the formulation taught by CN100526507 is relatively unstable due to ammonia evaporation at elevated temperature as will be seen later. The formulation described in WO 2015/156171 could be used; however the complexing agents used, aminophosphonates, do not give long enough stability to be of industrial interest.

It is desirable to have a ready to use solution which is stable during sufficient time to be of industrial interest, does not substantially attack copper or aluminum, and can fairly quickly dissolve any of the three commonly used barriers (TiN, Ti and TiW) selectively to other exposed metals (e.g. Copper, Aluminum and Tin or Tin alloys) with intrinsically good control of the etching profile.

BRIEF DESCRIPTION OF THE INVENTION

Accordingly, this is an object of the present invention to provide a stable formulation that etches Titanium based barriers selectively to Copper, Aluminum and Tin or its alloys, while easily maintaining a good control of the etching profiles.

To that end, the invention provides a solution for etching titanium based materials, comprising from about 27 w % to about 39 w % hydrogen peroxide, from about 0.2 w % to about 0.5 w % potassium hydroxide, and at about 0.002 w % to about 0.02 w % 1,2-Diaminocyclohexane-N,N,N,N Tetra acetic Acid (CDTA), the rest being water, Advantageously said solution has a pH comprised between about 7 and about 8.

In a preferred embodiment, the solution for etching titanium-based materials comprises from about 27 w % to about 39 w % hydrogen peroxide, from about 0.2 w % to about 0.5 w % potassium hydroxide, and at about 0.002 w % to about 0.02 w % 1,2-Diaminocyclohexane-N,N,N,N Tetra acetic Acid (CDTA), the rest being water, said solution comprises no corrosion inhibitor, and has a pH comprised between about 7 and about 8.

In the present text, the term "the rest being water" means that the percentage in weight of water corresponds to 100% minus the sum of the percentages in weight of the other chemical substances present in the solution. As such, the percentage in weight of water depends on the percentages in weight of the chemical substances present in the solution or susceptible to be present in the solution. The chemical substances include at least hydrogen peroxide, potassium hydroxide and 1,2-Diaminocyclohexane-N,N,N,N Tetra acetic Acid (CDTA). Other chemical substances can be present provided that they are not a corrosion inhibitor.

A solution as disclosed above allows for efficiently etching titanium based materials while avoiding corrosion of potentially exposed metals other than titanium, such as copper or aluminum for example.

In particular, being able to selectively remove Titanium compared to other exposed metals without using corrosion inhibitor allows for reducing the manufacturing costs of the etching solutions, therefore reducing the costs of the methods for etching microelectronic devices using such solutions.

In the present text, the term "microelectronic device" designates semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device material" are not meant to be limiting in any way and include any substrate or structure that will eventually become a microelectronic device or microelectronic assembly.

In the present text, the term "Titanium based barrier layer" means any thin film with a thickness comprised between 5 and 500 nm, composed of Titanium, Titanium Nitride, Titanium Tungsten or a mixture thereof.

As used herein, the term "about" is intended to correspond to ±5% of the stated value.

As used herein, the term "room temperature" means a temperature ranging from 20° C. to 25° C.

Advantageously, said etching solution is prepared by mixing (i) a concentrate made of potassium hydroxide at a concentration ranging from about 5 w % to about 30 w %, C.D.T.A at a concentration ranging from about 1% to about 4% of potassium hydroxide concentration, with (ii) hydrogen peroxide at a starting concentration ranging from about 30 w % to about 40 w %, so as to reach a pH comprised between about 7 and about 8.

Another object of the invention is a chemical composition for preparing the above-described solution by mixing said composition with concentrated hydrogen peroxide, said chemical composition comprising potassium hydroxide from about 5 w % to about 30 w %, C.D.T.A. at a concentration ranging from about 1% to about 5% of the potassium hydroxide concentration, the rest being water.

Another object of the invention is a method for etching a Titanium, Titanium nitride or Titanium Tungsten barrier layer from a microelectronic device, said method comprising contacting the Titanium, Titanium nitride or Titanium tungsten barrier layer with the above-mentioned etching solution, for a time sufficient to remove the Titanium, Titanium nitride or Titanium tungsten barrier layer.

According to an embodiment, the solution is prepared using a point of use blending technique to mix concentrated hydrogen peroxide at a starting concentration ranging from 30 w % to 40 w % with the above-mentioned chemical composition at an appropriate ratio so as to reach a pH comprised between about 7 and about 8.

According to an embodiment, the etching solution is disposed to waste drain right after dispense on the microelectronic device, or redirected to a chemical tank, for several hours or several substrates being etched.

According to an embodiment, the etching solution is heated and contacted with the microelectronic device at a temperature comprised between about 15 and about 60° C., preferably between about 20° C. and about 50° C.

A further object of the invention is a method for preparing the above-described etching solution. Said method comprises mixing the above-mentioned chemical composition with concentrated hydrogen peroxide at a starting concentration ranging from 30 w % to 40 w % so as to reach a pH comprised between 7 and 8.

BRIEF DESCRIPTION OF THE DRAWINGS

Other features and advantages of the invention will be apparent from the following description, based on the appended drawings wherein.

DETAILED DESCRIPTION OF EMBODIMENTS OF THE INVENTION

Figure 1:
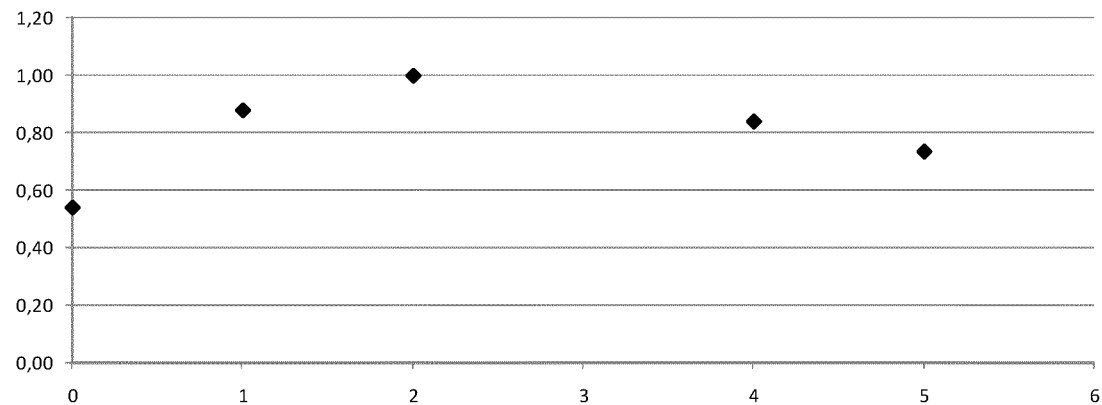
FIG. 1 is a graph showing the influence on the relative etch rate of C.D.T.A concentration (in % of the KOH concentration in the concentrate) in the mixture based on concentrated KOH at 30 w %, used to adjust the pH of 30 w % hydrogen peroxide at 7.5 (to determine the relative etch rate, the highest value is taken as a reference value equal to 1 and the other values are given relative to said reference value)

The real challenge lies in the difficulty to etch titanium oxide surface or interface at an acceptable rate and to remain selective to Aluminum and Copper metals. It is known from those skilled in the art that Titanium and Tungsten based materials can be dissolved in hydrogen peroxide at an appreciable rate. It is also known that raising the pH through addition of ammonia or any base can enhance not only the etch rate on bulk materials but also the dissolution rate of Titanium oxide, through the increase in the H2O-concentration which is thought to be the active specie in Titanium based materials etching. However, taken the actual limitation of most tools hardware, it is difficult to maintain a mixture at point of use with a stable pH, therefore, corrosion of exposed metals and peroxide decomposition will be hardly controlled.

The inventors discovered that potassium hydroxide was superior to all other bases in term of titanium etching rate and stability when mixed to concentrated hydrogen peroxide at a given pH. In addition, the use of CDTA (1,2-Diamino-cyclohexane-N,N,N,N Tetra acetic Acid) as complexing agent not only efficiently prevents the peroxide decomposition for several hours even at elevated temperature and with a pH up to 8, but increases significantly the Titanium etch rate of the KOH/hydrogen peroxide mixture at the tested concentrations.

Knowing that, the inventors decided to design a ready to use mixture based on concentrated hydrogen peroxide with a starting concentration comprised between 30 w % and 40 w % which pH is adjusted to a value between 7 and 8 by adding a concentrate solution composed of about 5 w % to about 30 w % of potassium hydroxide and CDTA at a concentration comprised between about 1% and about 5% of the potassium hydroxide concentration in the concentrate solution.

When higher than 40 w % hydrogen peroxide and/or a pH higher than 8 is used, the temperature safety margin becomes too tiny before self-accelerated decomposition can take place in case of accidental contamination or loosely controlled temperature.

When higher than 30 w % potassium hydroxide is used for the preparation of the concentrate, then it becomes difficult to dissolve CDTA to the appropriate concentration.

When lower than 5 w % potassium hydroxide is used for the concentrate preparation, then the water added to hydrogen peroxide to reach the target pH significantly reduces the efficiency of the final solution.

When CDTA concentration is higher than 5% of the potassium hydroxide concentration in the concentrate, the etch rate on Titanium of the final mixture is strikingly decreased.

When CDTA concentration is lower than 1% of the potassium hydroxide concentration in the concentrate, then the lifetime and the etch rate on Titanium of the final mixture are both significantly reduced.

Adjusting the pH to a value between 7 and 8 of the solution as described above allows for efficiently etching titanium based materials while avoiding corrosion of potentially exposed metals other than titanium, such as copper or aluminum for example.

Hence, the present invention provides a solution that etches Titanium-based materials selectively to other exposed metals without the use of corrosion inhibitor(s) usually required. FIG. 1 is a graph showing the influence of CDTA concentration in the mixture based on concentrated KOH at 30 w %, used to adjust the pH of 30 w % hydrogen peroxide at 7.5.

A solution for etching Titanium based barriers is described, said solution comprising, consisting of, or consisting essentially of hydrogen peroxide at a starting concentration between about 30 w % and about 40 w %, which pH is adjusted to a value comprised between about 7 and about 8 with the addition of an aqueous concentrate containing: (i) between about 5 w % and about 30 w % potassium hydroxide and (ii) CDTA at a concentration between about 1% and about 5% of the potassium hydroxide concentration. The solution effectively and efficiently dissolves Titanium based material from the surface of a microelectronic device having same thereon without substantially corroding other materials present on the microelectronic device such as copper, aluminum and Tin or its alloys with reduced peroxide decomposition even in case of metals loading, allowing the mixture to be "recirculated" for several hours without notably changing its etching properties.

In one embodiment, the final solution consists of or consists essentially of potassium hydroxide, hydrogen peroxide, CDTA and water.

In a preferred embodiment, the solution consists of or consists essentially of potassium hydroxide, hydrogen peroxide, CDTA, and water, and does not contain any corrosion inhibitor.

The corresponding final solution is approximately composed of about 27 w % to about 39 w % hydrogen peroxide, about 0.2 w % to about 0.5 w % potassium hydroxide and about 20 ppm to about 200 ppm of CDTA.

The w % Hydrogen peroxide entering in the solution of the present invention is stated as pure hydrogen peroxide as compared to total weight of the solution. The source of hydrogen peroxide can be commercially available hydrogen peroxide of any starting concentration equal to or above 30 w % with or without phosphates/phosphonates/stanates stabilizers, but can also be prepared by diluting with pure water a more concentrated solution of hydrogen peroxide.

The w % potassium hydroxide in the solution is stated as pure potassium hydroxide as compared to the total weight of the solution.

In a preferred embodiment, the final solution comprises, consists of, or consists essentially of about 27 w % to about 39 wt % hydrogen peroxide, about 0.0020 w % (20 ppm) to about 0.02 w % (200 ppm) cyclohexane diamine Tetra acetic acid, and about 0.2 w % to about 0.5 w % potassium hydroxide, the rest being water.

The solutions described herein are easily formulated by simple addition of the respective ingredients and mixing to homogeneous condition. Furthermore, the solutions may be readily formulated as single-package formulations or two-part formulations that are mixed at or before the point of use, e.g., the individual parts of the two-part formulation may be mixed at the tool or in a storage tank upstream of the tool. To that end, point of use blending techniques (e.g. online mixing of the constituents right before dispense) can be used.

The solution described can be used as "fresh dispense" that is to say by sending the chemistry to the waste drain or more interestingly by redirecting the same chemistry to the chemical tank for several hours.

In use of the solutions for removing Titanium based material from microelectronic devices having same thereon, the solutions typically are contacted with the device for a time of from about 45 sec to about 10 minutes, preferably about 1 minute to about 5 minutes, at temperature in a range of from about 15° C. to about 60° C., preferably about 25° C. to about 50° C. Such contacting times and temperatures are illustrative, and any other suitable time and temperature conditions may be employed that are efficacious to totally remove the Titanium based material from the device. Advantageously, the solutions effectively and efficiently remove Titanium based material from the surface of a microelectronic device having same thereon without substantially removing other materials present on the microelectronic device such as Copper, Aluminum Tin or Tin alloys.

The features and advantages of the solution are more fully shown by the illustrative examples discussed below.

EXAMPLES

Example 1

Six solutions were prepared as follows.

First, six concentrated mixtures containing 5.5 w % potassium hydroxide or the molar equivalent for the five other alcalins tested (Lithium, sodium, Cerium, tetramethylammonium and ammonium hydroxide) and 0.1 w % C.D.T.A. were prepared. Then, each concentrate was added to pure hydrogen peroxide so that to reach the same pH of about 7.5 in six different beakers.

The measured pH, temperature and calculated hydrogen peroxide concentration of each solution are reported in Table 1.

TABLE 1

| Cation used | pH | H2O2 concentration | T° C. |
|---|---|---|---|
| Potassium | 7.54 | 28.2 | 22.9 |
| ammonium | 7.59 | 21.2 | 22.6 |
| Lithium | 7.61 | 28.2 | 21.8 |
| Sodium | 7.54 | 21.2 | 22.9 |
| Cerium | 7.71 | 28.2 | 22.1 |
| Tetramethylammonium | 7.59 | 28.2 | 22.8 |

Figure 2:
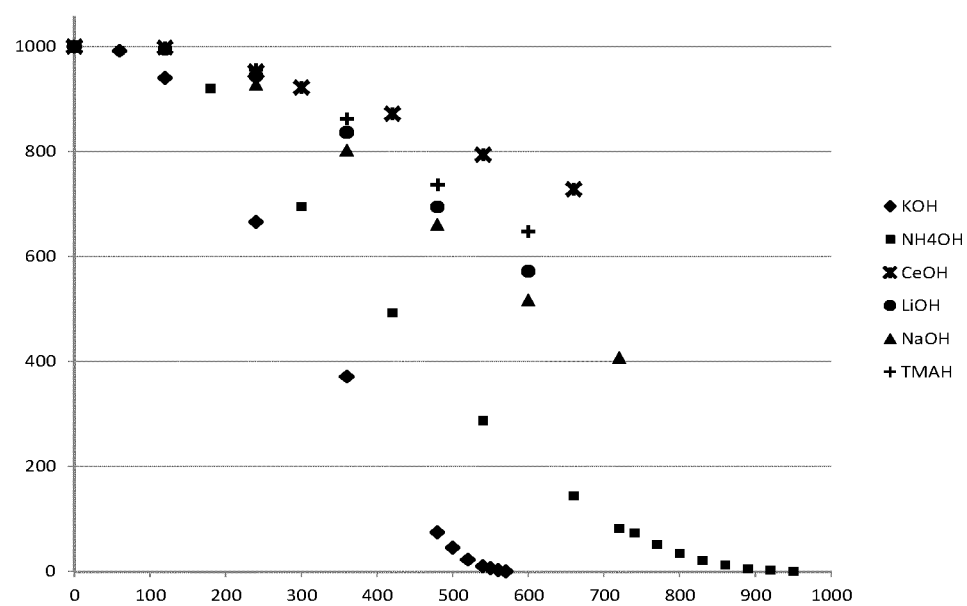
FIG. 2 is a graph showing the titanium thickness (A) vs immersion time (s) at room temperature for different alkaline hydrogen peroxide solutions at pH 7.5.

FIG. 2 shows the thickness change vs immersion time for 100 nm Titanium deposited by PVD on silicon oxide, immersed at room temperature in the different prepared solutions. The remaining Titanium thickness was evaluated through electrical resistance measurement. The remaining thickness was measured every minute or every 2 minutes.

This graph confirms that KOH gives higher Titanium etch rate as compared to other bases at the selected pH and peroxide concentration. It is also clear that the thickness change vs time is not linear along the film thickness, and it is somewhat difficult to determine a simple etch rate value.

The reduced etch rate at the beginning and the end of the film dissolution is attributed to the presence of a thin oxidized layer at both interfaces with air and with underlying dielectric (silicon oxide). The value given hereafter as "Etch Rate" will in reality correspond to a value of Titanium removed for a given time, thus incorporating the time needed to remove the top oxide layer.

In the following examples 2 to 4 the test were conducted accordingly to a standard test commonly used for hydrogen peroxide consisting in heating hydrogen peroxide at 96° C. in a special cell surmounted by a fractionating column avoiding water evaporation and allowing to assess the hydrogen peroxide concentration loss after 16 hours. This concentration loss is equivalent to the hydrogen peroxide loss observed in one year at 20° C.

Due to rapid thermal decomposition of the complexing agents used, the temperature for the test had to be reduced down to 65° C. Even though there is no easy correlation with the degradation that one would observe in one year, the test gives meaningful information and allows us to compare between different solutions and constituents.

The $H_2O_2$ concentration is evaluated before and after ageing and/or loading with contaminants by titration (permanganometric titration)

The etch rate given in these examples are calculated as twice the thickness removed in 30 s static immersion at 50° C. The thickness is evaluated by the bulk electrical resistance measurement of the remaining film through four points probe.

Every test is repeated twice and the values given are actually the average of two sets of results.

Example 2: Influence of the Constituents on Titanium Etch Rate and Solution Stability The following ten solutions where prepared as follows.

Pure 30 w % hydrogen peroxide was adjusted at pH 7.5 with concentrate solutions containing either 5.5 w % KOH or 8.2 w % of 28 w % $NH_4OH$, and different complexing agents. The complexing agents were added to the concentrate solutions before mixing with hydrogen peroxide at a concentration of 0.055 w % (about 30 ppm in the final mixture), 0.11 w % (about 60 ppm in the final mixture) or 022 w % (about 120 ppm in the final mixture).

The complexing agents tested or stability are CDTA (trans-1,2-Diaminocyclohexane-N,N,N,N Tetra acetic Acid), EDDS (Ethylenediaminedisuccinic acid), EDTA (Ethylenediamine tetra acetic acid) and DTPMP (diethylene triaminepentamethylphosphonic acid).

The approximate base concentration in the final mixture was calculated from the mass of concentrate used to adjust the pH at 7.5.

TABLE 2

|  | H2O2 w % | CDTA ppm | KOH w % | 28 w % NH4OH w % | EDTA ppm | D.T.P.M.P. ppm | E.D.D.S. ppm |
|---|---|---|---|---|---|---|---|
| solution 1 | 28.2 | 0 | 0.35 | 0 | 0 | 0 |  |
| solution 2 | 28.2 | 30 | 0.35 |  |  |  |  |
| solution 3 | 28.2 | 60 | 0.35 |  |  |  |  |
| solution 4 | 28.2 | 120 | 0.35 |  |  |  |  |
| solution 5 | 27.8 | 120 | 0.38 |  |  |  |  |
| solution 6 | 28.2 |  | 0.35 |  | 120 |  |  |
| solution 7 | 28.2 |  | 0.35 |  |  | 120 |  |
| solution 8 | 28.2 |  | 0.35 |  |  |  | 100 |
| solution 9 | 28.2 | 60 |  | 0.5 |  |  |  |
| solution 10 | 28.2 |  |  | 0.5 |  | 120 |  |

TABLE 3

|  | pH @ t0 | Ti Etch rate @ t0 | Delta [H2O2] in % after 16 h @ 60° C. | pH after 16 h @ 60° C. | Ti Etch rate after 16 h @ 60° C. |
|---|---|---|---|---|---|
| solution 1 | 7.56 | 382 | −100% | >12 | 0 |
| solution 2 | 7.52 | 715 | −14% | 7.84 | 645 |
| solution 3 | 7.5 | 721 | −10% | 7.77 | 678 |
| solution 4 | 7.54 | 602 | −5.50% | 7.61 | 587 |
| solution 5 | 7.89 | 906 | −13.00% | 8.15 | 810 |
| solution 6 | 7.52 | 378 | −45% | 9.1 | 130 |
| solution 7 | 7.55 | 401 | −24% | 8.05 | 263 |
| solution 8 | 7.51 | 431 | −33% | 8.39 | 281 |
| solution 9 | 7.53 | 449 | −13% | 6.9 | 250 |
| solution 10 | 7.52 | 396 | −28% | 6.44 | 109 |

It appears clearly that the couple KOH/CDTA is the best association in term of Titanium Etch Rate and stability, under the tested conditions. It is also evident from the result with solution 5 that when the pH is raised, the etch rate increases but the stability is degraded.

Example 3: Influence of Metallic Contaminants on the Stability of the Etching Solutions Four solutions were prepared with a similar procedure as described in example 2.

The solutions were heated at 50° C. in covered beakers, and the loading with titanium was achieved by immersing the equivalent of 2.5 wafers having a diameter of 300 mm per liter (¼ of wafer per 100 ml) for a time sufficient to remove all the 100 nm Titanium film present on the surface of the coupons. The solutions were evaluated in term of pH change and Titanium etch rate variation after contamination and after ageing with dissolved Titanium.

Table 4 teaches the composition of the four solutions.

TABLE 4

|  | H2O2 w % | C.D.T.A. ppm | KOH w % | E.D.D.S. ppm | D.T.P.M.P. ppm |
|---|---|---|---|---|---|
| solution 1 | 28.2 | 60 | 0.35 | 0 | 0 |
| solution 2 | 28.2 | 120 | 0.35 |  |  |
| solution 3 | 28.2 |  | 0.35 | 120 |  |
| solution 4 | 28.2 |  | 0.35 |  | 120 |

Table 5 shows the titanium etch rate (A/min) for each solution before titanium contamination, after titanium contamination and when the solution has been maintained 6 hours at 50° C.

TABLE 5

|  | pH @ t0 | Ti Etch rate @ t0 before Ti contamination | Ti Etch rate @ t0 after Ti contamination | Ti Etch rate after 6 h @ 50° C. |
|---|---|---|---|---|
| solution 1 | 7.54 | 713 | 709 | 639 |
| solution 2 | 7.51 | 632 | 619 | 594 |
| solution 3 | 7.54 | 458 | 396 | 131 |
| solution 4 | 7.56 | 455 | 404 | 289 |

This test shows that CDTA can efficiently prevent hydrogen peroxide decomposition even in the presence of severe Titanium contamination.

Example 4: Compatibility of the Solutions Towards Aluminum, Copper and Tin

Four solutions were prepared with the same procedure as in Example 3.

Phosphoric acid was added to the concentrate solution to check for its ability to protect Aluminum when the pH is increased. Phosphoric acid is a commonly used corrosion inhibitor of Aluminum.

Wafers coupons of 500 nm PVD Aluminum deposited on silicon oxide, 40 nm PVD copper deposited on silicon oxide and 1.5 µm Tin deposited on a thin 20 nm copper layer were used to evaluate the compatibility with these metals.

The solutions were heated at 50° C. and the coupons of Copper and Aluminum were immersed for an hour while Tin coupons were immersed only for 10 min due to delamination (flaking) observed with longer immersion times. The remaining film thickness value on the coupons was evaluated by electrical resistance measurement through four points probe.

Table 6 teaches the composition of the four solutions.

TABLE 6

|  | H2O2 w % | C.D.T.A. ppm | KOH w % | Phosphoric acid |
|---|---|---|---|---|
| solution 1 | 28.2 | 90 | 0.35 | 0 |
| solution 2 | 28.2 | 90 | 0.38 | 0 |
| solution 3 | 28 | 90 | 0.44 | 0.1 w % |
| solution 4 | 27.9 | 90 | 0.48 | 0.2 w % |

Table 7 shows the etch rate of aluminum, copper and titanium nitride for each solution.

TABLE 7

|  | pH | Al etch A/hr | Al etch (A) in 5 mn | Cu etch A/hr | Cu etch (A) in 5 mn | Tin etched A/mn |
|---|---|---|---|---|---|---|
| solution 1 | 7.49 | 48 | 4 | 86 | 7 | 17 |
| solution 2 | 7.96 | 160 | 13 | 148 | 12 | 21 |
| solution 3 | 8.02 | 95 | 8 | 132 | 11 | 16 |
| solution 4 | 7.97 | <10 | <1 | 151 | 13 | 19 |

Remark: Solutions 3 and 4 as shown in Tables 6 and 7 are not part of the invention and serve as a basis for the comparison with solutions 1 and 2 discussed below.

The addition of a low concentration of phosphoric acid efficiently prevents Aluminum corrosion when the pH of the solution is raised. All of the solutions tested here with pH buffered between 7 and 8 are compatible with the metals under evaluation, indeed, the time to completely dissolve a usual Titanium barrier is in the 2 to 5 min range, therefore Copper, Aluminum and Tin etching will remain in a few Angstroms to tens of Angstroms range (as can be seen form columns 4&6), thus not compromising the electrical performances of the devices which dimension are in the µm range for the targeted applications. Moreover, the results show that Tin is selectively etched compared to Aluminum even when no corrosion inhibitor of Aluminum is present in the solution.

Example 5

Two solutions starting from two different sources of hydrogen peroxide (source A and source B), adjusted at pH 7.6 containing about 28 w % hydrogen peroxide about 0.36 w % potassium hydroxide and about 0.012 w % (120 ppm) CDTA, were provided for test in a production tool (SEMITOOL RAIDER™ single wafer tool). The tests vehicles were patterned 300 mm wafers simulating dense and small copper pillars 5-6 µm in diameter. The goal of the test was to check for the time needed to remove a 100 nm Titanium barrier layer on structured wafers in an industrial tool. The solution was maintained heated at 50° C.±2° C. The solution flow rate used was 750 ml/min.

Figure 3:
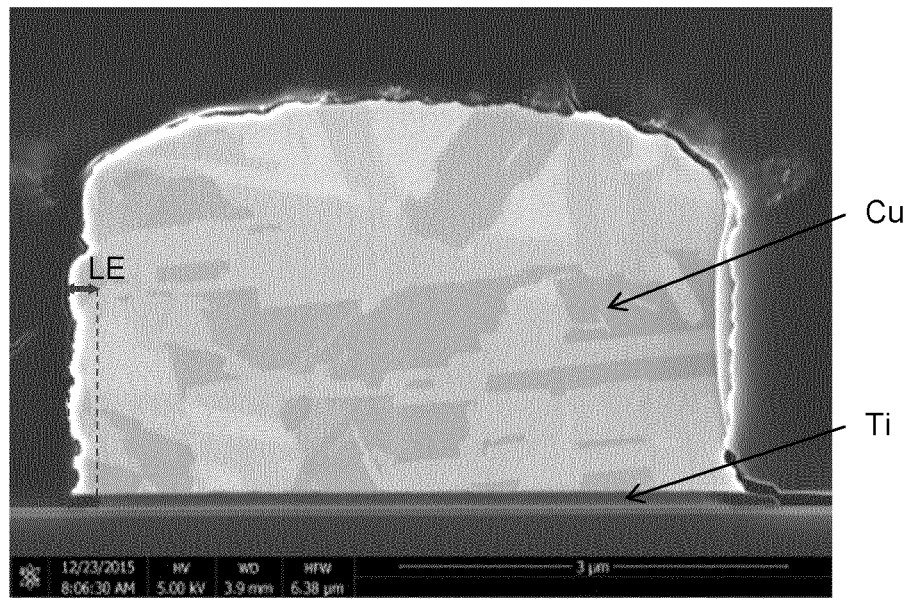
FIG. 3 is a picture showing lateral titanium etch under a copper pillar in a fresh etching solution.

The time needed to remove all the film was evaluated and a 50% over-etch was applied (corresponding to 150 nm total Titanium removal). SEM pictures were taken to evaluate the amount of lateral titanium removed under the copper. Below 0.2 µm under-etch (lateral etch, noted LE) of the Titanium film was achieved (see FIG. 3).

Figure 4:
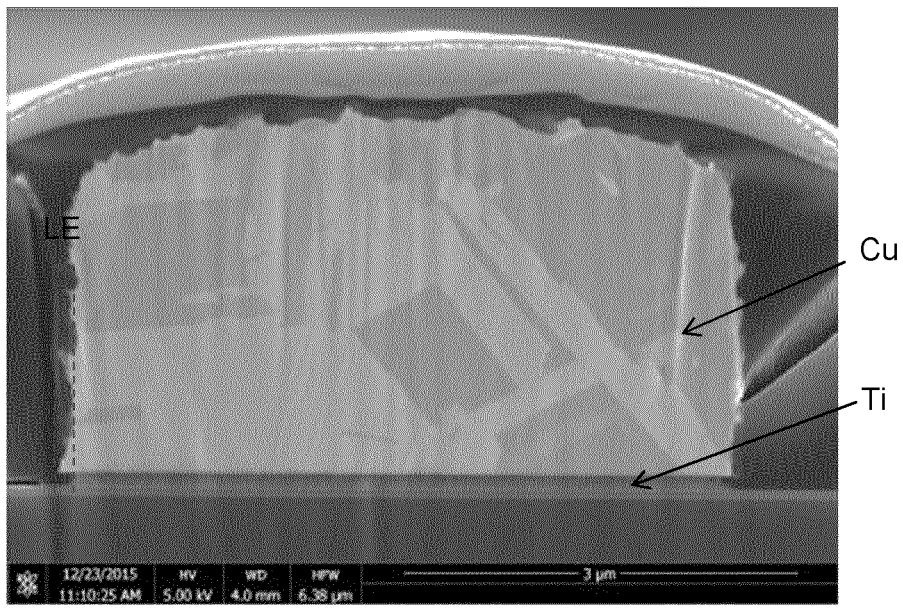
FIG. 4 is a picture showing lateral titanium etch under the copper pillar with an etching solution maintained in a bath after 24 hours at 50° C.
Figure 5:
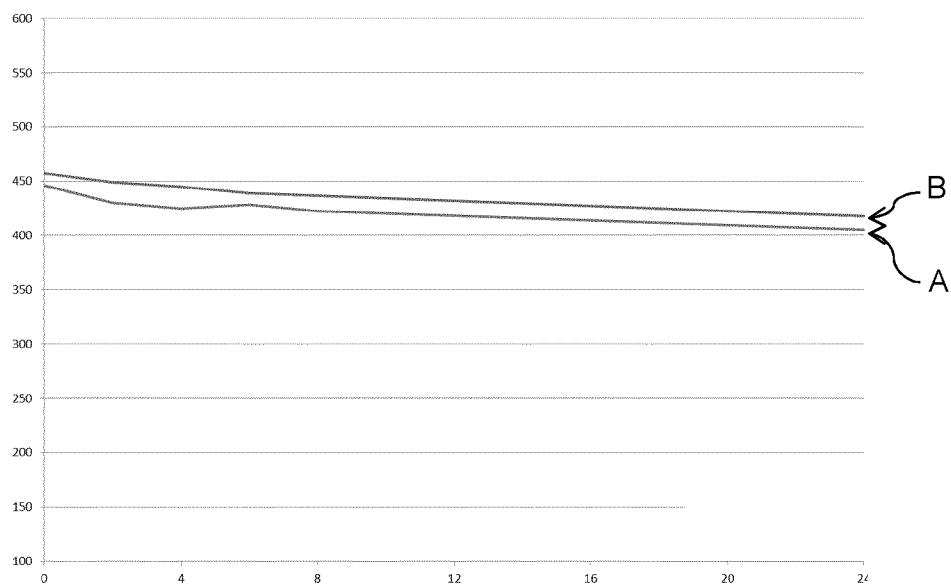
FIG. 5 is a graph showing change in titanium etching rate (A/min) vs ageing time (bath time in hrs) at 50° C. in a production tool: curve A corresponds to $H_2O_2$ source A; curve B corresponds to $H_2O_2$ source B.

The bath was left for 24 hours in the tank heated at 50° C.±2° C. The titanium etch rate and lateral etch were again evaluated. It was found that Titanium etch rate was only 9% lower than with the fresh solution (see FIG. 5) and the lateral etch LE under copper was not increased as compared to the fresh solution (see FIG. 4).

It was thus confirmed that in a production processing equipment, the solution can achieve high and stable etch rate for several hours at 50° C., and keep a quite controllable lateral etch which is of raising concern for smaller structures.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein.

REFERENCES

WO2008/114616
US2015/0210966
CN100526507
WO 2015/156171

The invention claimed is:

1. A solution for etching titanium based materials, consisting of from about 27 wt. % to about 39 wt. % of hydrogen peroxide, from about 0.2 wt. % to about 0.5 wt. % of potassium hydroxide, and from about 0.002 wt. % to about 0.02 wt. % of 1,2-Diaminocyclohexane-N,N,N,N Tetra acetic Acid (CDTA), and the rest being water, wherein said solution comprises no corrosion inhibitor, and has a pH of between about 7 and about 8.

2. The solution of claim 1, said etching solution being prepared by mixing (i) a concentrate made of potassium hydroxide at a concentration ranging from about 5 wt. % to about 30 wt. %, C.D.T.A at a concentration ranging from about 1% to about 4% of potassium hydroxide concentration, with (ii) hydrogen peroxide at a starting concentration ranging from about 30 wt. % to about 40 wt. %, so as to reach a pH comprised between about 7 and about 8.

3. A chemical composition for preparing a solution according to claim 1 by mixing said chemical composition with concentrated hydrogen peroxide, said chemical composition comprising potassium hydroxide from about 5 wt. % to about 30 wt. %, C.D.T.A. at a concentration ranging from about 1% to about 5% of the potassium hydroxide concentration, the rest being water.

4. A method of etching a Titanium, Titanium nitride or Titanium Tungsten barrier layer from a microelectronic device, said method comprising contacting the Titanium, Titanium nitride or Titanium tungsten barrier layer with the solution of claim 1, for a time sufficient to remove the Titanium, Titanium nitride or Titanium tungsten barrier layer.

5. The method of claim 4, wherein the solution is prepared using a point of use blending technique to mix concentrated hydrogen peroxide at a starting concentration ranging from 30 wt. % to 40 wt. % with a chemical composition comprising potassium hydroxide from about 5 wt. % to about 30 wt. %, C.D.T.A at a concentration ranging from about 1% to about 5% of the potassium hydroxide concentration, the rest being water, at an appropriate ratio so as to reach a pH comprised between about 7 and about 8.

6. The method of claim 4, wherein the etching solution is disposed to waste drain right after dispense on the microelectronic device, or redirected to a chemical tank, for several hours or several substrates being etched.

7. The method of claim 4, wherein the etching solution is heated and contacted with the microelectronic device at a temperature comprised between about 15° C. and about 60° C., preferably between about 20° C. and about 50° C.

8. A method for preparing an etching solution according to claim 1, comprising mixing a chemical composition comprising potassium hydroxide from about 5 wt. % to about 30 wt. %, C.D.T.A at a concentration ranging from about 1% to about 5% of the potassium hydroxide concentration, the rest being water, with concentrated hydrogen peroxide at a starting concentration ranging from 30 wt. % to 40 wt. % so as to reach a pH comprised between 7 and 8.

* * * * *